United States Patent
Kaneko et al.

(10) Patent No.: US 10,975,700 B2
(45) Date of Patent: Apr. 13, 2021

(54) TURBINE BLADE DESIGNING METHOD, TURBINE BLADE MANUFACTURING METHOD, AND TURBINE BLADE

(71) Applicant: MITSUBISHI HEAVY INDUSTRIES, LTD., Tokyo (JP)

(72) Inventors: Hideaki Kaneko, Tokyo (JP); Kenji Yamamoto, Tokyo (JP); Takanori Karato, Tokyo (JP); Norifumi Hirata, Kanagawa (JP); Naoya Fujita, Kanagawa (JP)

(73) Assignee: MITSUBISHI HEAVY INDUSTRIES, LTD., Tokyo (JP)

( * ) Notice: Subject to any disclaimer, the term of this patent is extended or adjusted under 35 U.S.C. 154(b) by 257 days.

(21) Appl. No.: 16/088,885

(22) PCT Filed: Aug. 22, 2016

(86) PCT No.: PCT/JP2016/074367
§ 371 (c)(1),
(2) Date: Sep. 27, 2018

(87) PCT Pub. No.: WO2017/168777
PCT Pub. Date: Oct. 5, 2017

(65) Prior Publication Data
US 2019/0120060 A1 Apr. 25, 2019

(30) Foreign Application Priority Data
Mar. 31, 2016 (JP) .............................. JP2016-071250

(51) Int. Cl.
*B22D 27/04* (2006.01)
*F01D 5/14* (2006.01)
(Continued)

(52) U.S. Cl.
CPC ............. *F01D 5/147* (2013.01); *B22D 27/04* (2013.01); *B22D 27/045* (2013.01); *C21D 9/00* (2013.01);
(Continued)

(58) Field of Classification Search
CPC ........ B22D 27/04; B22D 27/045; C21D 9/00; C22F 1/10; F01D 5/14; F01D 5/147;
(Continued)

(56) References Cited

U.S. PATENT DOCUMENTS 3,790,303 A    2/1974   Endres
4,078,951 A * 3/1978   Denzine et al. .......... C22F 1/10
        148/404

(Continued)

FOREIGN PATENT DOCUMENTS

EP    2 298 946    3/2011
JP    55-57369    4/1980
(Continued)

OTHER PUBLICATIONS

International Search Report dated Nov. 8, 2016, of International (PCT) Application No. PCT/JP2016/074367 with English translation.

(Continued)

*Primary Examiner* — Kevin P Kerns
(74) *Attorney, Agent, or Firm* — Wenderoth, Lind & Ponack, L.L.P.

(57) ABSTRACT

A turbine blade designing method is for designing a turbine blade formed using a metal material in which creep including diffusion creep and dislocation creep occurs by heating. The turbine blade designing method includes: acquiring temperature distribution data relating to temperature distribution in the turbine blade to be heated; acquiring creep strength distribution data relating to distribution of the creep (Continued)

strength required for the turbine blade to be heated; from the correlation data, based on the temperature distribution data and the creep strength distribution data, setting the crystal grain size of a high-temperature portion that is the diffusion creep temperature range of the turbine blade to a size coarser than the reference crystal grain size, and setting the crystal grain size of a low-temperature portion that is the dislocation creep temperature range of the turbine blade to a size finer than the reference crystal grain size.

6 Claims, 6 Drawing Sheets

(51) Int. Cl.
*F01D 5/28* (2006.01)
*C22F 1/10* (2006.01)
*F01D 25/00* (2006.01)
*C21D 9/00* (2006.01)
*G06F 30/17* (2020.01)

(52) U.S. Cl.
CPC .................. *C22F 1/10* (2013.01); *F01D 5/28* (2013.01); *F01D 25/00* (2013.01); *G06F 30/17* (2020.01); *F05D 2240/301* (2013.01)

(58) Field of Classification Search
CPC ...... F01D 5/28; F01D 25/00; F05D 2240/301; G06F 17/50; G06F 30/17
USPC ........................................ 164/4.1, 122, 122.1
See application file for complete search history.

(56) References Cited

U.S. PATENT DOCUMENTS

| | | | |
|---|---|---|---|
| 4,190,094 A | | 2/1980 | Giamei |
| 4,540,038 A | | 9/1985 | Burke |
| 4,935,072 A | * | 6/1990 | Nguyen-Dinh ......... C30B 29/52 |
| | | | 148/562 |
| 5,916,384 A | * | 6/1999 | Das .................... B23P 15/04 |
| | | | 148/522 |
| 10,239,156 B2 | * | 3/2019 | Gregg ................... B23K 26/12 |

FOREIGN PATENT DOCUMENTS

| | | |
|---|---|---|
| JP | 3-4301 | 1/1991 |
| JP | 08-200001 | 8/1996 |
| JP | 10-317105 | 12/1998 |
| JP | 2002-331353 | 11/2002 |
| JP | 2011-84812 | 4/2011 |
| JP | 2013-170558 | 9/2013 |

OTHER PUBLICATIONS

Written Opinion of International Searching Authority dated Nov. 8, 2016, of International (PCT) Application No. PCT/JP2016/074367 with English translation.

* cited by examiner

FIG.5

TURBINE BLADE DESIGNING METHOD, TURBINE BLADE MANUFACTURING METHOD, AND TURBINE BLADE

FIELD

The present invention relates to a turbine blade designing method, a turbine blade manufacturing method, and a turbine blade formed using a metal material.

BACKGROUND

Conventionally, a steam turbine blade manufacturing method for manufacturing a steam turbine blade having erosion resistance in which a high-hardness portion is locally formed, by locally heating the blade tip end portion of the steam turbine blade and locally refining a plurality of crystal grains has been known (for example, see Patent Literature 1).

Patent Literature 1: Japanese Patent Application Laid-open No. 2013-170558

SUMMARY

Technical Problem

In addition to the steam turbine blade, a turbine blade for a gas turbine and the like is heated by high-temperature flue gas while the gas turbine is operated. When the turbine blade is heated by flue gas in a relatively wide temperature range, creep including diffusion creep and dislocation creep occurs. The diffusion creep occurs more easily in a high-temperature range, and the dislocation creep occurs more easily in a low-temperature range. In other words, in the turbine blade, the diffusion creep tends to be dominant in a high-temperature portion where the temperature becomes high, and the dislocation creep tends to be dominant in a low-temperature portion where the temperature becomes low.

In the turbine blade disclosed in the Patent Literature 1, the crystal grains in the blade tip end portion are fine. However, when the crystal grains are fine, the turbine blade is weak in strength in the area where diffusion creep is dominant. In other words, when the blade tip end portion is the high-temperature portion, the durability may be reduced because the diffusion creep becomes dominant and the crystal grains are fine.

Consequently, an object of the present invention is to provide a turbine blade designing method, a turbine blade manufacturing method, and a turbine blade capable of improving durability against creep including diffusion creep and dislocation creep.

Solution to Problem

A turbine blade designing method of the present invention is for designing a turbine blade formed using a metal material in which creep including diffusion creep and dislocation creep occurs by heating. Correlation data is prepared in advance, in which a heating temperature range, creep strength of the creep that occurs in the turbine blade, and a crystal grain size of the metal material of the turbine blade are associated with one another, the heating temperature range being a temperature range including a diffusion creep temperature range, a dislocation creep temperature range, and a transition temperature range, the diffusion creep temperature range being a temperature range in which the diffusion creep occurs more easily than the dislocation creep, the dislocation creep temperature range being a temperature range in which the dislocation creep occurs more easily than the diffusion creep and which has lower temperature than the diffusion creep temperature range, the transition temperature range being a temperature range shifting from one temperature range to another temperature range between the diffusion creep temperature range and the dislocation creep temperature range. In the correlation data, the heating temperature range, the creep strength, and the crystal grain size are associated with one another so that when a temperature of the turbine blade to be heated is in the diffusion creep temperature range, the crystal grain size of the turbine blade corresponding to the creep strength of a predetermined level becomes coarser than a reference crystal grain size, the reference crystal grain size being the crystal grain size corresponding to the creep strength of the predetermined level when temperature of the turbine blade to be heated is in the transition temperature range, and so that when the temperature of the turbine blade to be heated is in the dislocation creep temperature range, the crystal grain size of the turbine blade corresponding to the creep strength of the predetermined level becomes finer than the reference crystal grain size. The turbine blade designing method includes a temperature distribution acquiring step of acquiring temperature distribution data relating to temperature distribution in the turbine blade to be heated; a creep strength acquiring step of acquiring creep strength distribution data relating to distribution of the creep strength required for the turbine blade to be heated; and a crystal grain size setting step of, from the correlation data, based on the temperature distribution data and the creep strength distribution data, setting the crystal grain size of a high-temperature portion that is the diffusion creep temperature range of the turbine blade to a size coarser than the reference crystal grain size, and setting the crystal grain size of a low-temperature portion that is the dislocation creep temperature range of the turbine blade to a size finer than the reference crystal grain size.

With this configuration, it is possible to set a suitable crystal grain size based on the temperature distribution and the creep strength distribution in the turbine blade. That is, it is possible to increase the durability of the high-temperature portion of the turbine blade against the diffusion creep by setting the crystal grain size to be coarse. Moreover, it is possible to increase the durability of the low-temperature portion of the turbine blade against the dislocation creep by setting the crystal grain size to be fine. Consequently, it is possible to improve the durability of the turbine blade in which creep including diffusion creep and dislocation creep occurs. For example, a nickel (Ni) based alloy or a cobalt (Co) based alloy is used as the metal material. However, it is not particularly limited thereto, and stainless steel may also be used, as long as the diffusion creep and the dislocation creep can occur in the metal material. Moreover, the temperature distribution acquiring step and the creep strength acquiring step may be executed one after another, and the temperature distribution acquiring step may be executed first, or the creep strength acquiring step may be executed first.

It is preferable that the turbine blade includes a blade base portion provided at a base end portion side and an airfoil portion provided continuously from a tip end portion side of the blade base portion, and the crystal grain size setting step includes setting the crystal grain size to a size coarser from the base end portion side toward the tip end portion side in the airfoil portion of the turbine blade.

With this configuration, when the temperature of the tip end portion of the airfoil portion becomes high and the temperature of the base end portion of the airfoil portion becomes low, it is possible to increase the durability of the tip end portion against the diffusion creep by setting the grain size of the tip end portion of the airfoil portion to be coarse. Moreover, it is possible to increase the durability of the base end portion against the dislocation creep by setting the grain size of the base end portion of the airfoil portion to be fine.

It is preferable that the turbine blade further includes a cooling chamber provided in the base end portion side of the airfoil portion, and a plurality of cooling paths communicatively connected to the tip end portion side of the cooling chamber inside the airfoil portion, and the crystal grain size setting step includes setting the crystal grain size to a size finer than the reference crystal grain size in the cooling chamber of the turbine blade.

With this configuration, it is possible to increase the durability of the cooling chamber against the dislocation creep by setting the grain size in the cooling chamber to be fine.

A turbine blade manufacturing method of the present invention is for manufacturing the turbine blade designed by the turbine blade designing method described above. The turbine blade manufacturing method includes a pouring step of pouring molten metal that is the metal material into a mold of the turbine blade; a cooling step of cooling the molten metal by setting cooling speed of the high-temperature portion of the turbine blade to a speed slower than cooling speed of the low-temperature portion, and setting the cooling speed of the low-temperature portion of the turbine blade to a speed faster than the cooling speed of the high-temperature portion; and a mold removal step of removing the mold and extracting the turbine blade that is the molten metal after being solidified.

With this configuration, it is possible to provide the high-temperature portion in which the crystal grain size is coarse by reducing the cooling speed of the high-temperature portion of the turbine blade. Moreover, it is possible to provide the low-temperature portion in which the crystal grain size is fine by increasing the cooling speed of the low-temperature portion of the turbine blade. Consequently, it is possible to manufacture a turbine blade highly durable against creep including diffusion creep and dislocation creep.

A turbine blade of the present invention is formed using a metal material in which creep including diffusion creep and dislocation creep occurs by heating. The turbine blade includes a high-temperature portion that is a diffusion creep temperature range in which the diffusion creep occurs more easily than the dislocation creep; and a low-temperature portion that is a dislocation creep temperature range in which the dislocation creep occurs more easily than the diffusion creep and which has lower temperature than the diffusion creep temperature range. A crystal grain size of the high-temperature portion becomes coarser than a reference crystal grain size at the creep strength of the predetermined level, the reference crystal grain size being a crystal grain size of the turbine blade corresponding to the creep strength of a predetermined level in a transition temperature range, the transition temperature range being a temperature range shifting from one temperature range to another temperature range between the diffusion creep temperature range and the dislocation creep temperature range. A crystal grain size of the low-temperature portion becomes finer than the reference crystal grain size at the creep strength of the predetermined level.

With this configuration, it is possible to increase the durability of the high-temperature portion of the turbine blade against the diffusion creep by setting the crystal grain size to be coarse. Moreover, it is possible to increase the durability of the low-temperature portion of the turbine blade against the dislocation creep by setting the crystal grain size to be fine. Consequently, it is possible to provide the turbine blade highly durable against creep including diffusion creep and dislocation creep.

It is preferable that the turbine blade further includes a blade base portion provided at a base end portion side; and an airfoil portion provided continuously from a tip end portion side of the blade base portion, wherein the crystal grain size of the airfoil portion becomes coarser from the base end portion side toward the tip end portion side.

With this configuration, when the temperature of the tip end portion of the airfoil portion becomes high and the temperature of the base end portion of the airfoil portion becomes low, it is possible to increase the durability of the tip end portion against the diffusion creep by setting the grain size of the tip end portion of the airfoil portion to be coarse. Moreover, it is possible to increase the durability of the base end portion against the dislocation creep by setting the grain size of the base end portion of the airfoil portion to be fine.

It is preferable that the turbine blade further includes a cooling chamber provided in the base end portion side of the airfoil portion; and a plurality of cooling paths communicatively connected to the tip end portion side of the cooling chamber inside the airfoil portion, wherein the cooling chamber is the low-temperature portion.

With this configuration, it is possible to increase the durability of the cooling chamber against the dislocation creep by setting the grain size of the cooling chamber that is to be the low-temperature portion to be fine.

Another turbine blade of the present invention is formed using a metal material, and includes a blade base portion provided at a base end portion side; and an airfoil portion provided continuously from a tip end portion side of the blade base portion. A crystal grain size of the airfoil portion becomes coarser from the base end portion side toward the tip end portion side.

With this configuration, when the temperature of the tip end portion of the airfoil portion becomes high, and the temperature of the base end portion of the airfoil portion becomes low, it is possible to increase the durability of the tip end portion against the diffusion creep by setting the grain size of the tip end portion of the airfoil portion to be coarse. Moreover, it is possible to increase the durability of the base end portion against the dislocation creep by setting the grain size of the base end portion of the airfoil portion to be fine.

DESCRIPTION OF EMBODIMENTS

Hereinafter, an embodiment according to the present invention will be described in detail with reference to the accompanying drawings. It is to be understood that this invention is not limited to this embodiment. Moreover, components in the following embodiment include components that can be easily replaced by a person skilled in the art, or components that are substantially the same as those components. Furthermore, the components described below can be combined with one another as appropriate. Still furthermore, when there are a plurality of the embodiments, the embodiments can be combined with one another.

Embodiment

Figure 1:
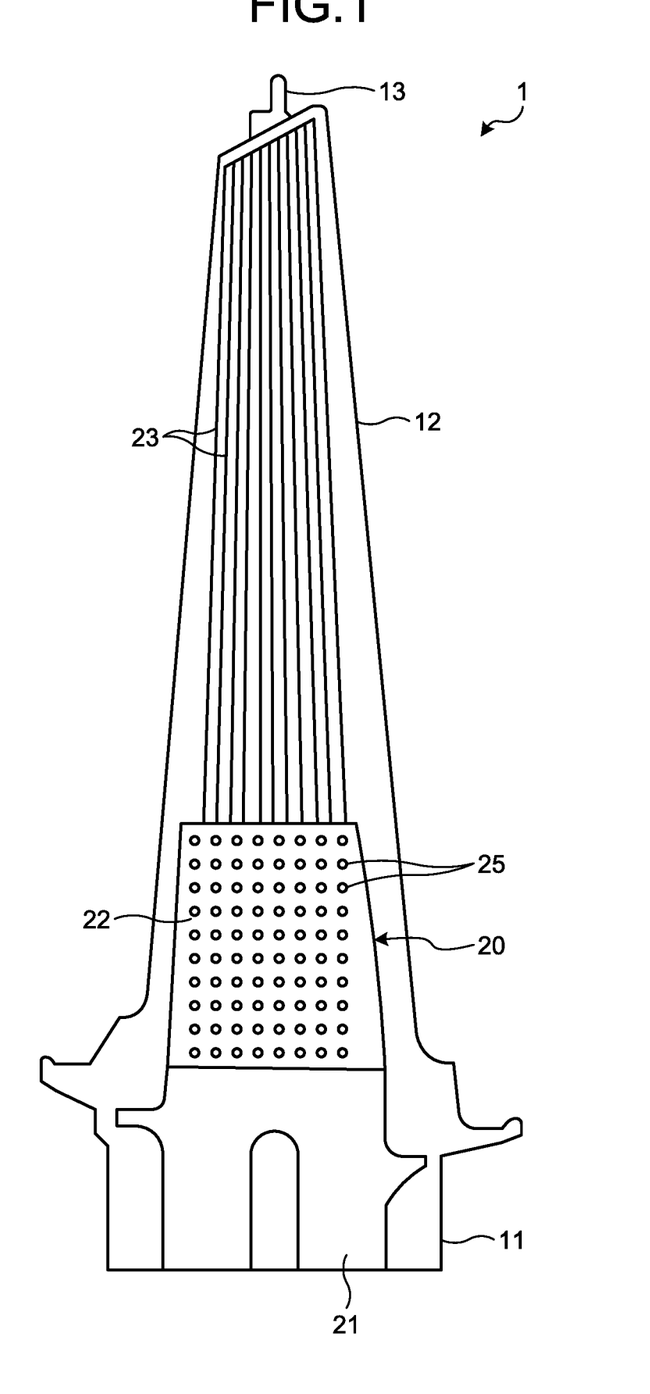
FIG. 1 is a sectional view illustrating a turbine blade according to the present embodiment.
Figure 2:
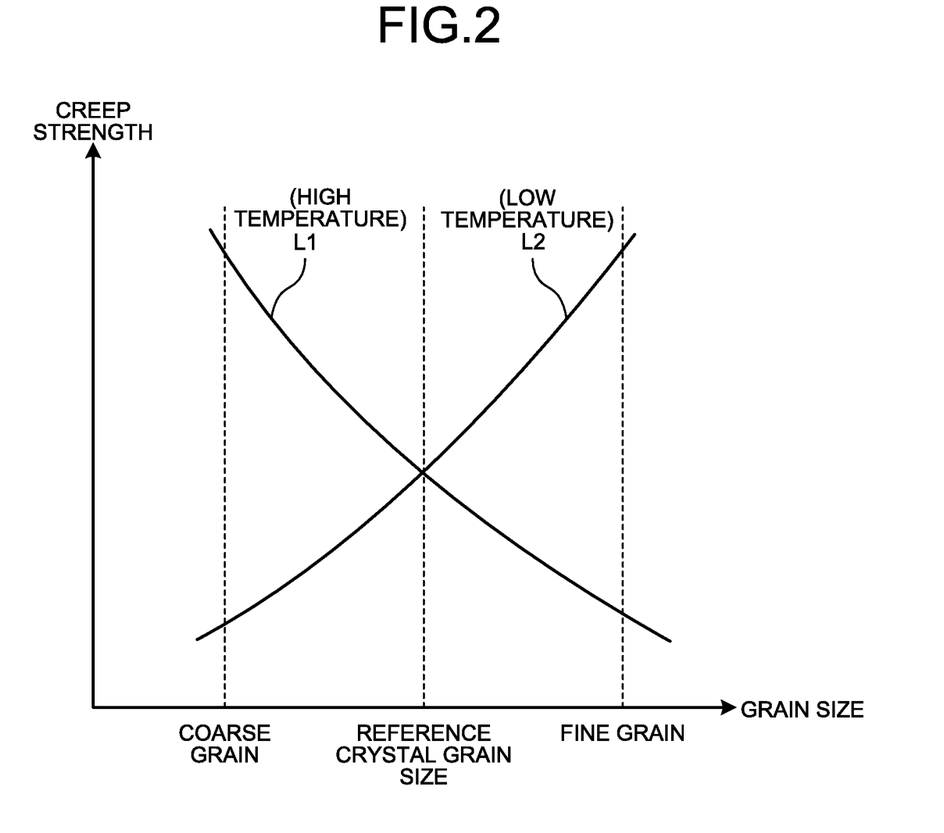
FIG. 2 is a graph relating to correlation data used in a turbine blade designing method according to the present embodiment.
Figure 3:
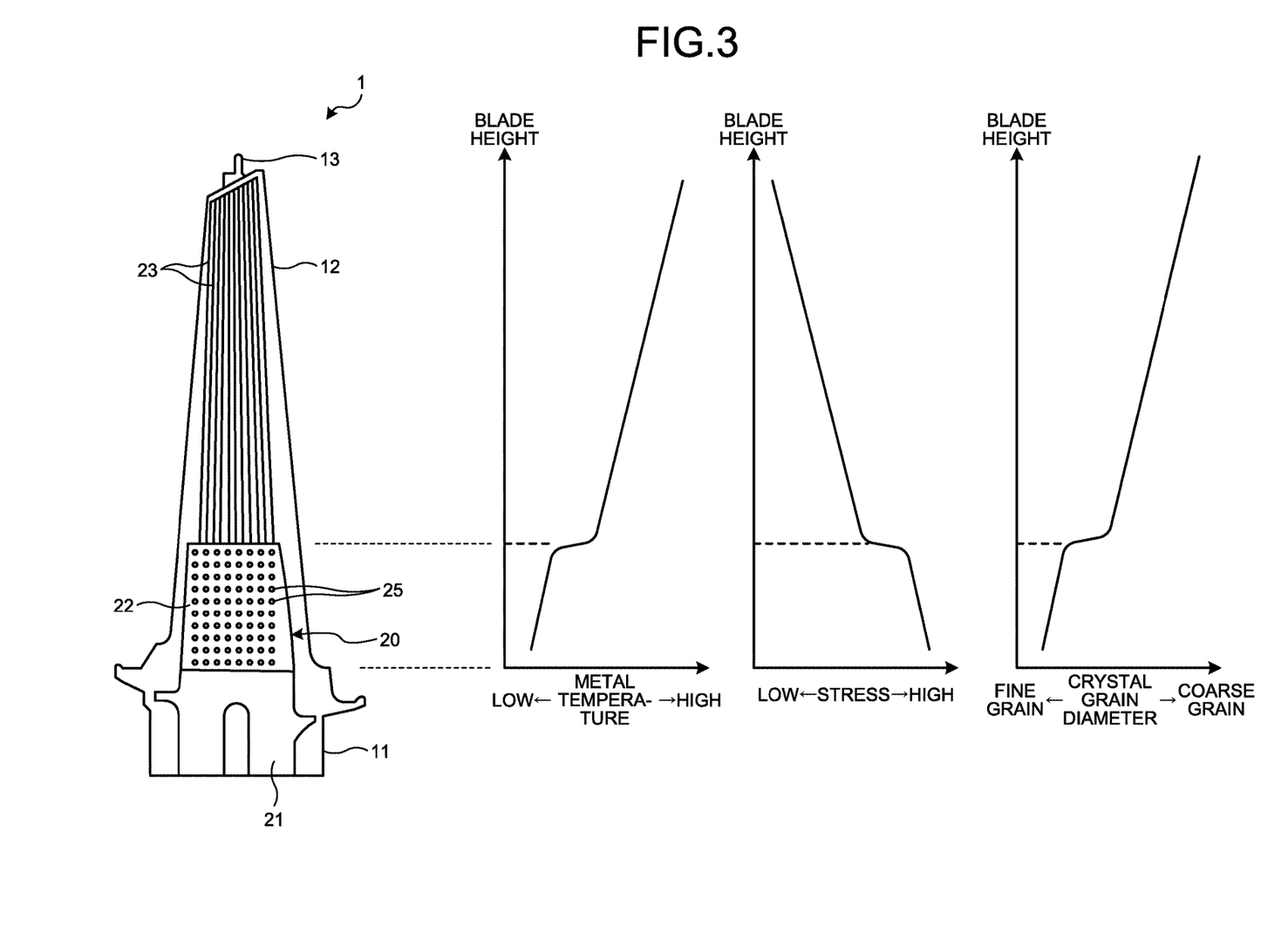
FIG. 3 is an explanatory diagram relating to load applied to the turbine blade according to the present embodiment and a crystal grain size.
Figure 4:
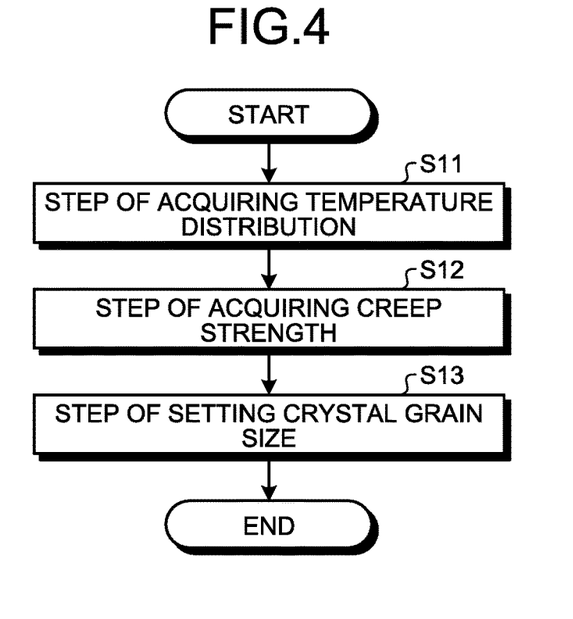
FIG. 4 is a flowchart relating to the turbine blade designing method according to the present embodiment.
Figure 5:
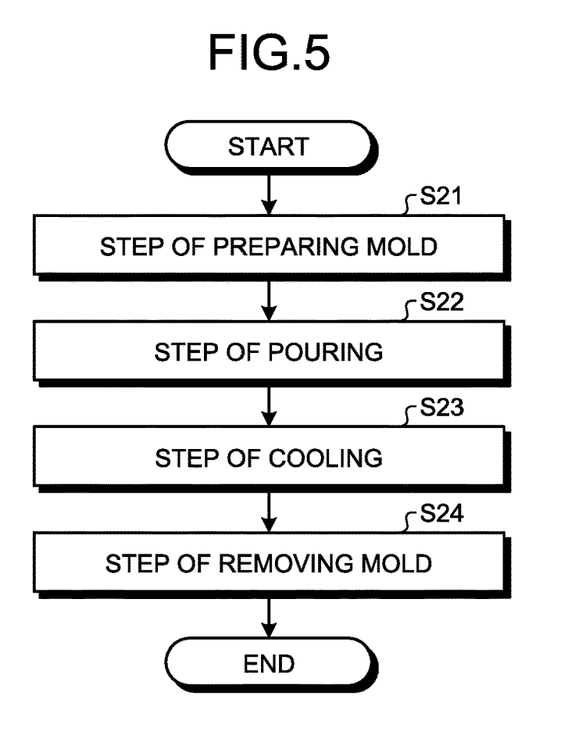
FIG. 5 is a flowchart relating to a turbine blade manufacturing method according to the present embodiment.

FIG. 1 is a sectional view illustrating a turbine blade according to the present embodiment. FIG. 2 is a graph relating to correlation data used in a turbine blade designing method according to the present embodiment. FIG. 3 is an explanatory diagram relating to load applied to the turbine blade according to the present embodiment and a crystal grain size. FIG. 4 is a flowchart relating to the turbine blade designing method according to the present embodiment. FIG. 5 is a flowchart relating to a turbine blade manufacturing method according to the present embodiment.

A turbine blade 1 according to the present embodiment is formed using a metal material, and is designed by a turbine blade designing method of the present embodiment. For example, the turbine blade 1 is a turbine blade provided in a gas turbine. For example, a Ni-based alloy or a Co-based alloy is used as the metal material. First, the turbine blade 1 to be designed will be explained with reference to FIG. 1. In the present embodiment, the turbine blade 1 is described as a turbine blade. However, it is not particularly limited thereto, and the turbine blade 1 may also be a turbine vane.

As illustrated in FIG. 1, the turbine blade 1 includes a blade base portion 11, an airfoil portion 12, and a shroud 13 in the order starting from the base end portion side.

For example, the blade base portion 11 is formed in a tree-shape, and is a portion to be fixed to a rotor of the gas turbine. The airfoil portion 12 is provided at the tip end portion side of the blade base portion 11, and extends in a longitudinal direction (radial direction of the rotor) from the blade base portion 11 toward the tip end portion side.

The peripheral surface of the airfoil portion 12 is a blade surface to which high-temperature flue gas generated in a gas turbine combustor blows. The length of the airfoil portion 12 in the longitudinal direction is the blade height of the airfoil portion 12. The shroud 13 is provided at the tip end side of the airfoil portion 12, the shroud 13 facing the inner peripheral surface of a casing through which the flue gas flows. The shroud 13 can be connected to the shroud 13 of another turbine blade 1 that is adjacent to the turbine blade 1.

Moreover, a cooling structure 20 is formed inside the turbine blade 1. The cooling structure 20 includes a cooling air introduction flow passage 21 formed at the blade base portion 11, a cooling chamber 22 formed at the airfoil portion 12 side relative to the cooling air introduction flow passage 21, and a plurality of cooling paths 23 formed at the airfoil portion 12 side relative to the cooling chamber 22. The cooling air introduction flow passage 21 is a flow passage that extends from the end surface of the blade base portion 11 toward the cooling chamber 22, and introduces cooling air from the outside to the inside of the turbine blade 1. The cooling chamber 22 is communicably connected to the cooling air introduction flow passage 21, and cooling air is introduced from the cooling air introduction flow passage 21. Moreover, a plurality of pin fins 25 are provided in the cooling chamber 22. The pin fins 25 are cooled by the cooling air that flows through the cooling chamber 22. The pin fins 25 then cool the base end side of the airfoil portion 12 of the turbine blade 1. The cooling paths 23 are communicably connected to the cooling chamber 22, and the cooling air from the cooling chamber 22 flows through the cooling paths 23. The cooling air that flows through the cooling paths 23 cools the tip end side of the airfoil portion 12 of the turbine blade 1. The cooling air flowing through the cooling paths 23 is discharged from the blade base portion 11 of the turbine blade 1 through a return flow passage, which is not illustrated, or discharged to the outside of the turbine blade 1 through an air injection hole, which is not illustrated, communicably connected to each of the cooling paths 23.

Stress is applied to the turbine blade 1 described above as a result of centrifugal force, when the turbine blade 1 is fixed to the rotor of the gas turbine and rotated. Creep occurs in the turbine blade 1 when the turbine blade 1 is heated while the stress is being applied. Consequently, the turbine blade 1 is designed so as to have a predetermined creep strength that satisfies the required performance, relative to the creep that occurs based on the stress and the heating temperature.

In this example, the creep includes diffusion creep and dislocation creep. The diffusion creep is dominant in a high-temperature range where heating temperature is high. In other words, the high-temperature range is a temperature range where the diffusion creep occurs more easily than the dislocation creep (diffusion creep temperature range), and is a diffusion creep dominant range. Moreover, the creep deformation rate of the diffusion creep is increased, as the crystal grain diameter of the metal material that constitutes the turbine blade 1 becomes finer (smaller) in the diffusion creep temperature range. In other words, the creep deformation rate can be reduced by setting the crystal grain diameter of the metal material that constitutes the turbine blade 1 to be coarser (larger) in the diffusion creep temperature range. The dislocation creep is dominant in a low-temperature range where heating temperature is low. In other words, the low-temperature range is a temperature range where the dislocation creep occurs more easily than the diffusion creep (dislocation creep temperature range), and is a dislocation creep dominant range. Moreover, the creep deformation rate of the dislocation creep is increased as the crystal grain diameter of the metal material that constitutes the turbine blade 1 becomes coarser (larger) in the dislocation creep temperature range. In other words, the creep deformation rate can be reduced by setting the crystal grain diameter of the metal material that constitutes the turbine blade 1 to be finer (smaller) in the dislocation creep temperature range. A transition temperature range is a temperature range shifting from one temperature range to another temperature range between the diffusion creep temperature range and the dislocation creep temperature range. In other words, the temperature in the transition temperature range is such that the diffusion creep and the dislocation creep occur at substantially the same rate. The diffusion creep temperature range, the dislocation creep temperature range, and the transition temperature range are different temperature ranges depending on the type of the metal material being used.

Next, correlation data used in the designing method of the turbine blade 1 according to the present embodiment will be described with reference to FIG. 2. As illustrated in FIG. 2, the correlation data is data in which the heating temperature range of the turbine blade 1, the creep strength of the creep that occurs in the turbine blade 1, and the crystal grain size of the metal material of the turbine blade 1 are associated with one another. In FIG. 2, the vertical axis is the creep strength and the horizontal axis is the grain size. Moreover, the line L1 is variation in the creep strength in the high-temperature range that is to be the diffusion creep temperature range, and the line L2 is variation in the creep strength in the low-temperature range that is to be the dislocation creep temperature range. A point where the line L1 and the line L2 intersect with each other is the transition temperature (transition temperature range), and the crystal grain size at the transition temperature is set as a reference crystal grain size.

In the correlation data in FIG. 2, the line L1 indicates that the creep strength increases as the grain size becomes coarser than the reference crystal grain size. In other words, in the diffusion creep temperature range, the creep strength increases as the grain size becomes coarser. On the other hand, the creep strength decreases as the grain size becomes finer than the reference crystal grain size. In other words, in the diffusion creep temperature range, the creep strength decreases as the grain size becomes finer. Moreover, the line L2 indicates that the creep strength decreases as the grain size becomes coarser than the reference crystal grain size. In the dislocation creep temperature range, the creep strength decreases as the grain size becomes coarser. On the other hand, the creep strength increases as the grain size becomes finer than the reference crystal grain size. In other words, in the dislocation creep temperature range, the creep strength increases as the grain size becomes finer.

Next, heat and load including stress applied to the turbine blade 1 will be explained with reference to FIG. 3, and the turbine blade designing method for designing the turbine blade 1 will be explained with reference to FIG. 4 using the correlation data described above.

As illustrated in FIG. 4, in the designing method of the turbine blade 1, a step of acquiring temperature distribution (step S11) for acquiring temperature distribution data relating to the temperature distribution in the turbine blade 1 that is heated when the gas turbine is operated, through analysis and the like will be executed first. In the present embodiment, the turbine blade 1 illustrated in FIG. 1 includes the cooling structure 20. Consequently, the temperature distribution in the turbine blade 1 acquired at the step of acquiring temperature distribution S11 is such that the temperature of the inner side of the turbine blade 1 is low (dislocation creep temperature range), and the temperature increases toward the outer side of the turbine blade 1. In other words, the inner side of the turbine blade 1 becomes a low-temperature portion, and the outer side of the turbine blade 1 becomes a high-temperature portion.

Moreover, as illustrated in FIG. 3, the temperature (metal temperature) distribution in the turbine blade 1 is such that the temperature of the base end portion side of the airfoil portion 12 is low (dislocation creep temperature range), and the temperature increases toward the tip end portion side of the airfoil portion 12 (diffusion creep temperature range). In other words, the base end portion side of the turbine blade 1 becomes the low-temperature portion, and the tip end portion side of the turbine blade 1 becomes the high-temperature portion. Moreover, in the turbine blade 1, the tip end portion side of the cooling chamber 22 of the cooling structure 20 is the low-temperature portion within a predetermined temperature range. Consequently, in the turbine blade 1, the temperature is continuously increased from the base end portion side of the airfoil portion 12 to the tip end portion side of the cooling chamber 22 of the cooling structure 20, the temperature further increases at the tip end portion side of the cooling chamber 22 of the cooling structure 20, and the temperature continuously increases from the tip end portion side of the cooling chamber 22 of the cooling structure 20 to the tip end portion side of the airfoil portion 12. In this manner, in the turbine blade 1, the temperature gradually increases from the base end portion side to the tip end portion side of the airfoil portion 12, with the tip end portion side of the cooling chamber 22 of the cooling structure 20 interposed therebetween.

Next, upon executing the step of acquiring temperature distribution S11, a step of acquiring creep strength (step S12) for acquiring creep strength distribution data relating to the distribution of creep strength required for the turbine blade 1 to be heated through analysis and the like will be executed. In the present embodiment, the base end portion side of the turbine blade 1 illustrated in FIG. 1 is the low-temperature high-stress side in which the stress is high and the temperature is low, and the tip end portion side of the turbine blade 1 is the high-temperature low-stress side in which the stress is low and the temperature is high. In other words, as illustrated in FIG. 3, in the turbine blade 1, the stress at the base end portion is high and the stress is reduced toward the tip end portion as a result of the centrifugal force. Moreover, in the turbine blade 1, the stress at the tip end portion side of the cooling chamber 22 of the cooling structure 20 is within a predetermined range. Consequently, in the turbine blade 1, the stress is continuously reduced from the base end portion side of the airfoil portion 12 to the tip end portion side of the cooling chamber 22 of the cooling structure 20, the stress is further reduced at the tip end portion side of the cooling chamber 22 of the cooling structure 20, and the stress is continuously reduced from the tip end portion side of the cooling chamber 22 of the cooling structure 20 to the tip end portion side of the airfoil portion 12. In this manner, in the turbine blade 1, the stress is gradually reduced from the base end portion side to the tip end portion side of the airfoil portion 12, with the tip end portion side of the cooling chamber 22 of the cooling structure 20 interposed therebetween. At the step of acquiring creep strength S12, creep strength data is acquired so that a predetermined creep strength allows creep occurring in the base end portion, which is the low-temperature high-stress side, and a predetermined creep strength allows creep occurring in the tip end portion, which is the high-temperature low-stress side.

Next, upon executing the step of acquiring creep strength S12, a step of setting crystal grain size (step S13) for setting the crystal grain size of the turbine blade 1 from the correlation data described above, on the basis of the temperature distribution data and the creep strength data will be executed. More specifically, at the step of setting crystal grain size S13, the crystal grain size of the turbine blade 1 in the high-temperature portion, which is the diffusion creep temperature range, is set coarser than the reference crystal grain size, and the crystal grain size of the turbine blade 1 in the low-temperature portion, which is the dislocation creep temperature range, is set finer than the reference crystal grain size.

As illustrated in FIG. 3, in the turbine blade 1, the crystal grain size (crystal grain diameter) of the base end portion becomes fine, and the crystal grain size becomes coarser toward the tip end portion. Moreover, in the turbine blade 1, the grain diameter at the tip end portion side of the cooling chamber 22 of the cooling structure 20 is within a predetermined range. Consequently, in the turbine blade 1, the grain diameter is continuously increased from the base end portion side of the airfoil portion 12 to the tip end portion side of the cooling chamber 22 of the cooling structure 20, the grain diameter is further increased at the tip end portion side of the cooling chamber 22 of the cooling structure 20, and the grain diameter is continuously increased from the tip end portion side of the cooling chamber 22 of the cooling structure 20 to the tip end portion side of the airfoil portion 12. In this manner, in the turbine blade 1, the grain diameter is gradually increased from the base end portion side to the tip end portion side of the airfoil portion 12, with the tip end portion side of the cooling chamber 22 of the cooling structure 20 interposed therebetween.

At the step of setting crystal grain size S13, the crystal grain size is set so as to be gradually increased from the low-temperature portion toward the high-temperature portion. However, it is not particularly limited thereto, and it is also possible to set the crystal grain size such that the crystal grain size is continuously increased from the low-temperature portion toward the high-temperature portion.

In this manner, by executing from step S11 to step S13, the crystal grain size of the turbine blade 1 is set in the designing method of the turbine blade 1.

Next, a turbine blade manufacturing method for manufacturing the turbine blade 1 designed by the designing method described above will be explained with reference to FIG. 5.

As illustrated in FIG. 5, in the manufacturing method of the turbine blade 1, a step of preparing mold (step S21) for preparing a mold used for forming the turbine blade 1 will be executed first. For example, at the step of preparing mold S21, a mold is prevented from being damaged when molten metal (melted metal material) is poured into the mold while the casting (turbine blade 1) is being manufactured, by disposing the mold in a heating furnace and preheating the mold.

Upon executing the step of preparing mold S21, a step of pouring (step S22) for pouring molten metal from an opening of the mold will be executed. Upon executing the step of pouring S22, a step of cooling (step S23) for cooling molten metal will be executed. At the step of cooling S23, the cooling speed of the high-temperature portion of the turbine blade 1 is made slower than the cooling speed of the low-temperature portion. In other words, at the step of cooling S23, the cooling speed of the low-temperature portion of the turbine blade 1 is made faster than the cooling speed of the high-temperature portion. The cooling speed can be controlled by adjusting the thickness of the mold, or adjusting the thickness of a heat insulating material provided around the mold.

Upon executing the step of cooling S23, a step of removing mold S24 for removing the mold and extracting the turbine blade 1 that is the solidified molten metal will be executed. At the step of removing mold S24, for example, the turbine blade 1 is extracted by breaking and removing the mold. The turbine blade 1 as a product is obtained by suitably executing a post-treatment on the extracted turbine blade 1.

In the turbine blade 1 illustrated in FIG. 1 that is manufactured by the manufacturing method as described above, the crystal grain size of the high-temperature portion is coarser than the reference crystal grain size, and the crystal grain size of the low-temperature portion is finer than the reference crystal grain size. More specifically, the turbine blade 1 illustrated in FIG. 1 is formed such that the crystal grain size of the inner side of the turbine blade 1 (around the cooling structure 20) is fine, and the crystal grain size of the outer side of the turbine blade 1 (surface side) is coarser than that of the inner side. Moreover, the turbine blade 1 illustrated in FIG. 1 is formed such that the crystal grain size of the base end portion side is fine, and the crystal grain size of the tip end portion side of the turbine blade 1 is coarser than that of the base end portion side as illustrated in FIG. 3. Moreover, in the turbine blade 1, the crystal grain size in the cooling chamber 22 of the cooling structure 20 is formed to be fine.

As described above, with the present embodiment, it is possible to set a suitable crystal grain size based on the temperature distribution and the creep strength distribution in the turbine blade 1. In other words, it is possible to increase the durability of the high-temperature portion of the turbine blade 1 against the diffusion creep by setting the crystal grain size to be coarse. Moreover, it is possible to increase the durability of the low-temperature portion of the turbine blade 1 against the dislocation creep by setting the crystal grain size to be fine. Consequently, it is possible to improve the durability of the turbine blade 1 in which creep including diffusion creep and dislocation creep occurs.

Moreover, with the present embodiment, when the temperature of the tip end portion of the airfoil portion 12 becomes high, and the temperature of the base end portion of the airfoil portion 12 becomes low, it is possible to increase the durability of the tip end portion against the diffusion creep by setting the grain size of the tip end portion of the airfoil portion 12 to be coarse. Moreover, it is possible to increase the durability of the base end portion against the dislocation creep by setting the grain size of the base end portion of the airfoil portion 12 to be fine.

Furthermore, with the present embodiment, it is possible to increase the durability of the cooling chamber 22 against the dislocation creep by setting the grain size in the cooling chamber 22 to be fine.

Still furthermore, with the present embodiment, it is possible to provide the high-temperature portion in which the crystal grain size is coarse by reducing the cooling speed of the high-temperature portion of the turbine blade 1. It is also possible to provide the low-temperature portion in which the crystal grain size is fine by increasing the cooling speed of the low-temperature portion of the turbine blade 1. Consequently, it is possible to manufacture the turbine blade 1 highly durable against creep including diffusion creep and dislocation creep.

In the present embodiment, a Ni-based alloy or a Co-based alloy is used as the metal material. However, it is not particularly limited thereto, and stainless steel may also be used as long as the diffusion creep and the dislocation creep can occur in the metal material. In this case, the diffusion creep temperature range, the dislocation creep temperature range, and the transition temperature range are different temperature ranges depending on the metal material being used.

Moreover, in the present embodiment, the step of acquiring creep strength S12 is executed after performing the step of acquiring temperature distribution S11 first. However, it is not particularly limited thereto, and the step of acquiring temperature distribution S11 may be executed after performing the step of acquiring creep strength S12 first.

Furthermore, the designing method of the present embodiment is applied to the turbine blade 1. However, the designing method of the present embodiment may also be applied to the other product such as a duct, in addition to the turbine blade 1.

Figure 6:
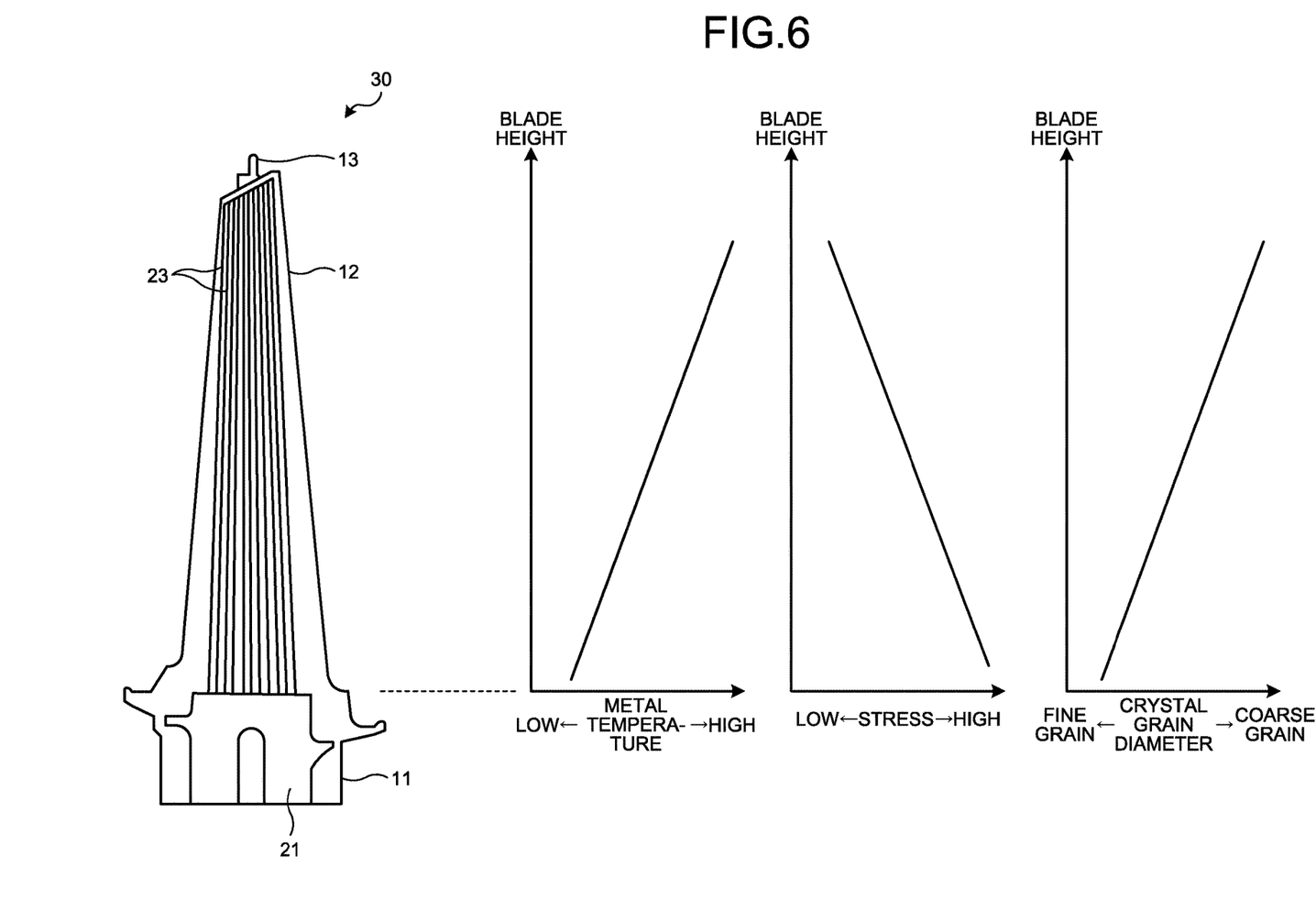
FIG. 6 is an explanatory diagram relating to another example of the turbine blade according to the present embodiment.
Figure 7:
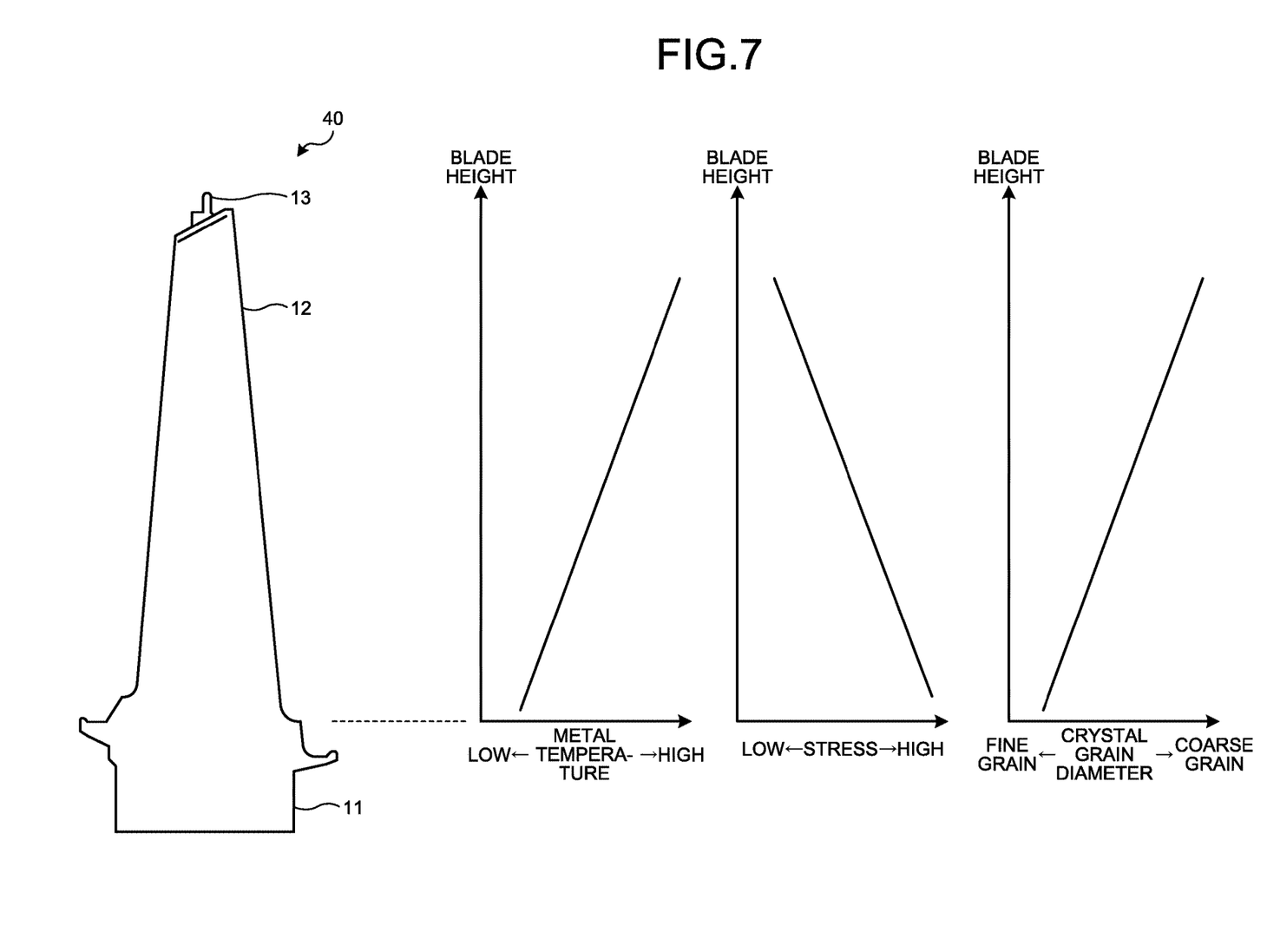
FIG. 7 is an explanatory diagram relating to another example of the turbine blade according to the present embodiment.

Still furthermore, in the present embodiment, the turbine blade 1 illustrated in FIG. 1 is described. However, the present embodiment may also be applied to a turbine blade 30 illustrated in FIG. 6 and a turbine blade 40 illustrated in FIG. 7. FIG. 6 and FIG. 7 are each an explanatory diagram relating to another example of the turbine blade according to the present embodiment.

The turbine blade 30 illustrated in FIG. 6 has a configuration in which the cooling chamber 22 is omitted from the cooling structure 20 of the turbine blade 1 illustrated in FIG. 1. In other words, the cooling structure 20 provided in the turbine blade 30 illustrated in FIG. 6 includes the cooling air introduction flow passage 21 and the cooling paths 23 formed at the airfoil portion 12 side relative to the cooling air introduction flow passage 21. Because the cooling air introduction flow passage 21 and the cooling paths 23 are the same as those in FIG. 1, the explanation thereof will be omitted.

In the turbine blade 30 illustrated in FIG. 6, the temperature distribution in the turbine blade 30 by heating is such that the temperature of the inner side of the turbine blade 30 becomes low (dislocation creep temperature range), and the temperature increases toward the outer side of the turbine blade 30 (diffusion creep temperature range). Moreover, in the turbine blade 30, the temperature distribution is such that the temperature of the base end portion side becomes low (dislocation creep temperature range), and the temperature continuously increases toward the tip end portion (diffusion creep temperature range). In other words, in the turbine blade 30, the base end portion side becomes the low-temperature portion, and the tip end portion side becomes the high-temperature portion.

The base end portion side of the turbine blade 30 illustrated in FIG. 6 is the high stress side in which the stress is high, and the tip end portion side of the turbine blade 30 is a low stress side in which the stress is low. In the turbine blade 30, the stress is continuously reduced from the base end portion side toward the tip end portion side.

Moreover, the turbine blade 30 illustrated in FIG. 6 is formed such that the crystal grain size of the base end portion side is fine, and the crystal grain size of the tip end portion side of the turbine blade 1 is coarser than that of the base end portion side. Consequently, the turbine blade 30 is formed such that the grain size is continuously increased from the base end portion side toward the tip end portion side.

The turbine blade 40 illustrated in FIG. 7 has a configuration in which the cooling structure 20 of the turbine blade 1 illustrated in FIG. 1 is omitted. In other words, the turbine blade 40 illustrated in FIG. 7 is a turbine blade with a solid inside that is not cooled. The temperature distribution, the stress distribution, and the crystal grain size distribution in the turbine blade 40 in FIG. 7 are the same as those of the turbine blade 30 in FIG. 6. Consequently, the explanation thereof will be omitted.

REFERENCE SIGNS LIST 1, 30, 40 Turbine blade
11 Blade base portion
12 Airfoil portion
13 Shroud
20 Cooling structure
21 Cooling air introduction flow passage
22 Cooling chamber
23 Cooling path

The invention claimed is:

1. A turbine blade designing method for designing a turbine blade formed using a metal material in which creep including diffusion creep and dislocation creep occurs by heating, wherein correlation data is prepared in advance, in which a heating temperature range, creep strength of the creep that occurs in the turbine blade, and a crystal grain size of the metal material of the turbine blade are associated with one another, the heating temperature range being a temperature range including a diffusion creep temperature range, a dislocation creep temperature range, and a transition temperature range, the diffusion creep temperature range being a temperature range in which the diffusion creep occurs more easily than the dislocation creep, the dislocation creep temperature range being a temperature range in which the dislocation creep occurs more easily than the diffusion creep and which has lower temperature than the diffusion creep temperature range, the transition temperature range being a temperature range shifting from one temperature range to another temperature range between the diffusion creep temperature range and the dislocation creep temperature range, and in the correlation data, the heating temperature range, the creep strength, and the crystal grain size are associated with one another so that when a temperature of the turbine blade to be heated is in the diffusion creep temperature range, the crystal grain size of the turbine blade corresponding to the creep strength of a predetermined level becomes coarser than a reference crystal grain size, the reference crystal grain size being the crystal grain size corresponding to the creep strength of the predetermined level when temperature of the turbine blade to be heated is in the transition temperature range, and so that when the temperature of the turbine blade to be heated is in the dislocation creep temperature range, the crystal grain size of the turbine blade corresponding to the creep strength of the predetermined level becomes finer than the reference crystal grain size, the turbine blade designing method comprising:

acquiring temperature distribution data relating to temperature distribution in the turbine blade to be heated;

acquiring creep strength distribution data relating to distribution of the creep strength required for the turbine blade to be heated; and from the correlation data, based on the temperature distribution data and the creep strength distribution data, setting the crystal grain size of a high-temperature portion that is the diffusion creep temperature range of the turbine blade to a size coarser than the reference crystal grain size, and;

from the correlation data, based on the temperature distribution data and the creep strength distribution data, setting the crystal grain size of a low-temperature portion that is the dislocation creep temperature range of the turbine blade to a size finer than the reference crystal grain size.

2. The turbine blade designing method according to claim 1, wherein the turbine blade includes a blade base portion provided at a base end portion side and an airfoil portion provided continuously from a tip end portion side of the blade base portion, and the turbine blade designing method further comprises setting the crystal grain size to a size coarser from the base end portion side toward the tip end portion side in the airfoil portion of the turbine blade.

3. A turbine blade manufacturing method for manufacturing the turbine blade designed by the turbine blade designing method according to claim 2, the turbine blade manufacturing method comprising:

pouring molten metal that is the metal material into a mold of the turbine blade;

cooling the molten metal by setting cooling speed of the high-temperature portion of the turbine blade to a speed slower than cooling speed of the low-temperature portion, and setting the cooling speed of the low-temperature portion of the turbine blade to a speed faster than the cooling speed of the high-temperature portion; and removing the mold and extracting the turbine blade that is the molten metal after being solidified.

4. The turbine blade designing method according to claim 1, wherein the turbine blade further includes a cooling chamber provided in the base end portion side of the airfoil portion, and a plurality of cooling paths communicatively connected to the tip end portion side of the cooling chamber inside the airfoil portion, and the turbine blade designing method further comprises setting the crystal grain size to a size finer than the reference crystal grain size in the cooling chamber of the turbine blade.

5. A turbine blade manufacturing method for manufacturing the turbine blade designed by the turbine blade designing method according to claim 4, the turbine blade manufacturing method comprising:

pouring molten metal that is the metal material into a mold of the turbine blade;

cooling the molten metal by setting cooling speed of the high-temperature portion of the turbine blade to a speed slower than cooling speed of the low-temperature portion, and setting the cooling speed of the low-temperature portion of the turbine blade to a speed faster than the cooling speed of the high-temperature portion; and removing the mold and extracting the turbine blade that is the molten metal after being solidified.

6. A turbine blade manufacturing method for manufacturing the turbine blade designed by the turbine blade designing method according to claim 1, the turbine blade manufacturing method comprising:

pouring molten metal that is the metal material into a mold of the turbine blade;

cooling the molten metal by setting cooling speed of the high-temperature portion of the turbine blade to a speed slower than cooling speed of the low-temperature portion, and setting the cooling speed of the low-temperature portion of the turbine blade to a speed faster than the cooling speed of the high-temperature portion; and removing the mold and extracting the turbine blade that is the molten metal after being solidified.

\* \* \* \* \*